United States Patent
Tsai et al.

(10) Patent No.: US 10,943,828 B2
(45) Date of Patent: Mar. 9, 2021

(54) RESIDUE-FREE METAL GATE CUTTING FOR FIN-LIKE FIELD EFFECT TRANSISTOR

(71) Applicant: Taiwan Semiconductor Manufacturing Co., Ltd., Hsin-Chu (TW)

(72) Inventors: Ya-Yi Tsai, Hsinchu (TW); Yi-Hsuan Hsiao, Hsinchu (TW); Shu-Yuan Ku, Hsinchu County (TW); Ryan Chia-Jen Chen, Chiayi (TW); Ming-Ching Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/665,252

(22) Filed: Oct. 28, 2019

(65) Prior Publication Data
US 2020/0058557 A1 Feb. 20, 2020

Related U.S. Application Data

(63) Continuation of application No. 15/938,812, filed on Mar. 28, 2018, now Pat. No. 10,460,994.

(60) Provisional application No. 62/592,826, filed on Nov. 30, 2017.

(51) Int. Cl.
*H01L 21/8234* (2006.01)
*H01L 27/088* (2006.01)

(52) U.S. Cl.
CPC ........... *H01L 21/823437* (2013.01); *H01L 21/823431* (2013.01); *H01L 21/823481* (2013.01); *H01L 27/0886* (2013.01)

(58) Field of Classification Search
CPC ..... H01L 21/823437; H01L 21/823431; H01L 27/0886
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |

(Continued)

*Primary Examiner* — Sitaramarao S Yechuri
(74) *Attorney, Agent, or Firm* — Haynes and Boone, LLP

(57) ABSTRACT

Metal gate cutting techniques for fin-like field effect transistors (FinFETs) are disclosed herein. An exemplary method includes receiving an integrated circuit (IC) device structure that includes a substrate, one or more fins disposed over the substrate, a plurality of gate structures disposed over the fins, a dielectric layer disposed between and adjacent to the gate structures, and a patterning layer disposed over the gate structures. The gate structures traverses the fins and includes first and second gate structures. The method further includes: forming an opening in the patterning layer to expose a portion of the first gate structure, a portion of the second gate structure, and a portion of the dielectric layer; and removing the exposed portion of the first gate structure, the exposed portion of the second gate structure, and the exposed portion of the dielectric layer.

20 Claims, 13 Drawing Sheets

(56) References Cited

U.S. PATENT DOCUMENTS

| | | |
|---|---|---|
| 9,520,482 B1 | 12/2016 | Chang et al. |
| 9,576,814 B2 | 2/2017 | Wu et al. |
| 2008/0286972 A1 | 11/2008 | Dalton et al. |
| 2013/0114924 A1 | 5/2013 | Loh et al. |
| 2014/0054714 A1* | 2/2014 | Baars ............... H01L 29/66545 257/368 |
| 2014/0227857 A1* | 8/2014 | Youn ................. H01L 21/82348 438/427 |
| 2015/0228647 A1* | 8/2015 | Chang ............... H01L 21/82343 257/401 |
| 2016/0056181 A1* | 2/2016 | Anderson ............ H01L 21/845 257/347 |
| 2016/0247680 A1* | 8/2016 | O'Meara ........... H01L 21/31144 |
| 2016/0260637 A1* | 9/2016 | Huang ............... H01L 21/32139 |
| 2017/0092643 A1* | 3/2017 | Tseng ................ H01L 21/82348 |
| 2017/0213823 A1* | 7/2017 | Cha .................... H01L 27/0207 |
| 2018/0211866 A1* | 7/2018 | Cheng ............... H01L 21/82343 |
| 2018/0277440 A1 | 9/2018 | Yu et al. |
| 2019/0164839 A1 | 5/2019 | Tsai et al. |

* cited by examiner

RESIDUE-FREE METAL GATE CUTTING FOR FIN-LIKE FIELD EFFECT TRANSISTOR

The present application is a continuation of U.S. patent application Ser. No. 15/938,812, filed Mar. 28, 2018, which claims priority to U.S. Provisional Patent Application No. 62/592,826, entitled "Residue-Free Metal Gate Cutting for Fin-Like Field Effect Transistor" and filed Nov. 30, 2017, each of which is hereby incorporated by reference in its entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as fin-like field effect transistor (FinFET) technologies progress towards smaller feature sizes (e.g., 32 nanometers (nm), 28 nm, 20 nm, and below), FinFET fabrication processes are significantly constrained by decreasing process margins. In particular, decreasing fin pitches and increasing fin heights are significantly constraining abilities of existing metal gate cutting techniques to fully remove certain portions of metal gates without leaving metal residue, which impacts system performance. Accordingly, although existing metal gate cutting techniques have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
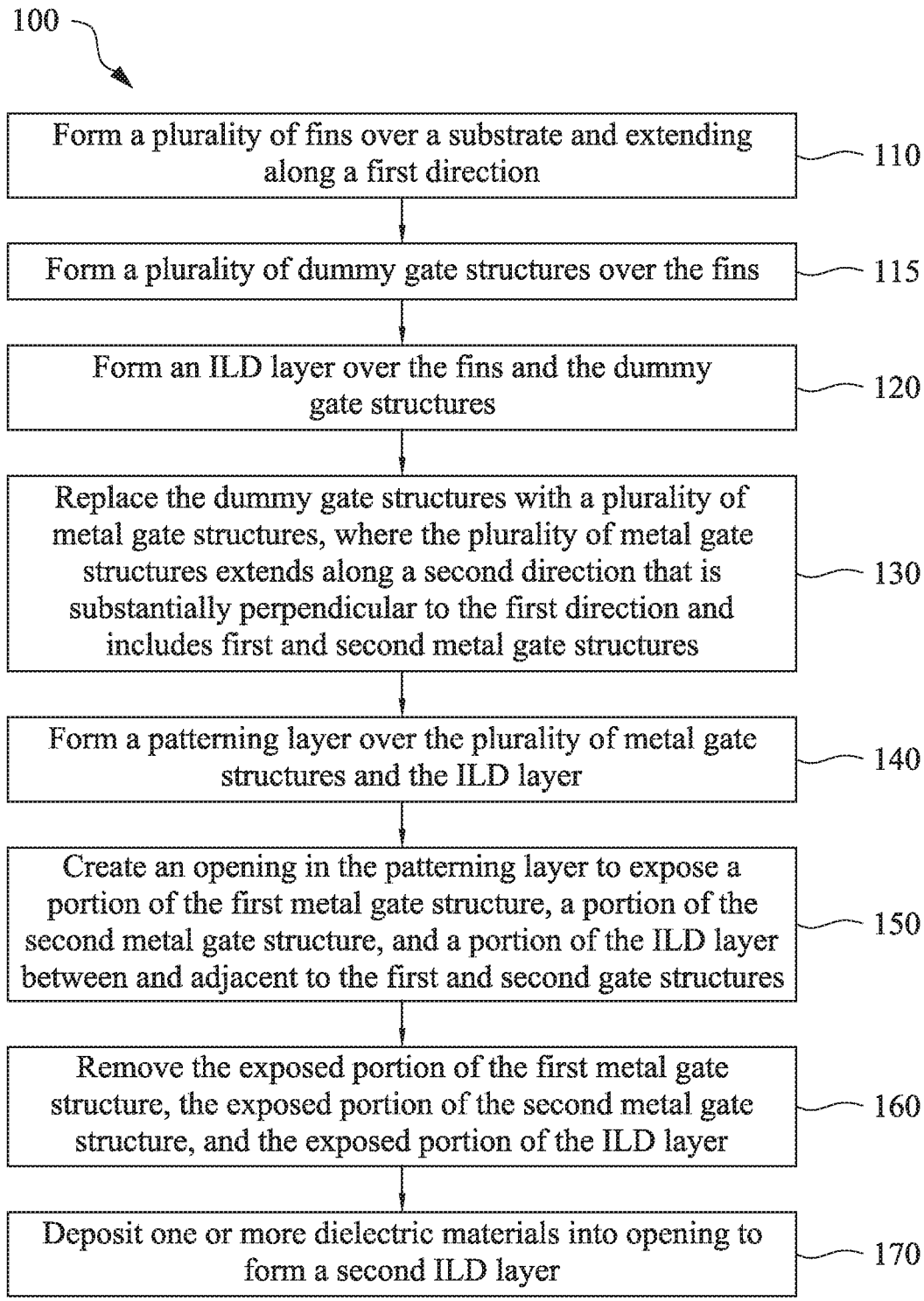
FIG. 1 is a flow chart of a method for fabricating a fin-like field effect transistor (FinFET) device according to various aspects of the present disclosure.

The present disclosure relates generally to integrated circuit devices, and more particularly, to fin-like field effect transistor (FinFET) devices and techniques for cutting metal gate structures for FinFETs.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

As FinFET technologies progress towards smaller technology nodes (such as 16 nm, 10 nm, 7 nm, 5 nm, and below), decreasing fin pitch and increasing fin height are placing significant constraints on traditional metal gate cutting techniques. As an example, metal gates are often selectively cut to form various circuit configurations. However, conventional methods of metal gate cutting via etching only target metal gates themselves and do not remove spacers or inter-layer dielectric (ILD) layers disposed between metal gates. Consequently, unless a metal gate cut window is over etched, it is difficult to remove metal residue formed at the bottom of the cut window. Such metal residue may lead to potential isolation or insulation problems for an integrated circuit (IC) device. Further, if the cut window is over etched to remove the metal residue, the horizontal dimension of the cut window tends to increase due to horizontal etching by the etchant, thereby undesirably changing the critical dimension (CD) of metal gates.

Metal gate cutting techniques disclosed herein overcome such challenges. Disclosed gate cutting techniques achieve residue-free cutting of metal gate structures without any risk of horizontal expansion of cut windows, thereby improving FinFET device operation. According to some embodiments, in order to selectively cut metal gate structures, a cut window is created in an overlaying patterning layer, thereby exposing portions of the metal gate structures as well as portions of an ILD layer disposed between and adjacent to the metal gate structures. The exposed materials are then simultaneously removed using anisotropic etching, leaving no metal residue in the cut window. Multiple etching cycles may be used to remove the exposed materials in thickness increments, and an etch protection layer is used in each etching cycle to prevent horizontal expansion of the cut window. This and other benefits of the present disclosure will become evident by referring to the accompanying figures and the associated descriptions below. Note that different embodiments may have different advantages, and no particular advantage is necessarily required of any embodiment.

Figure 5A:
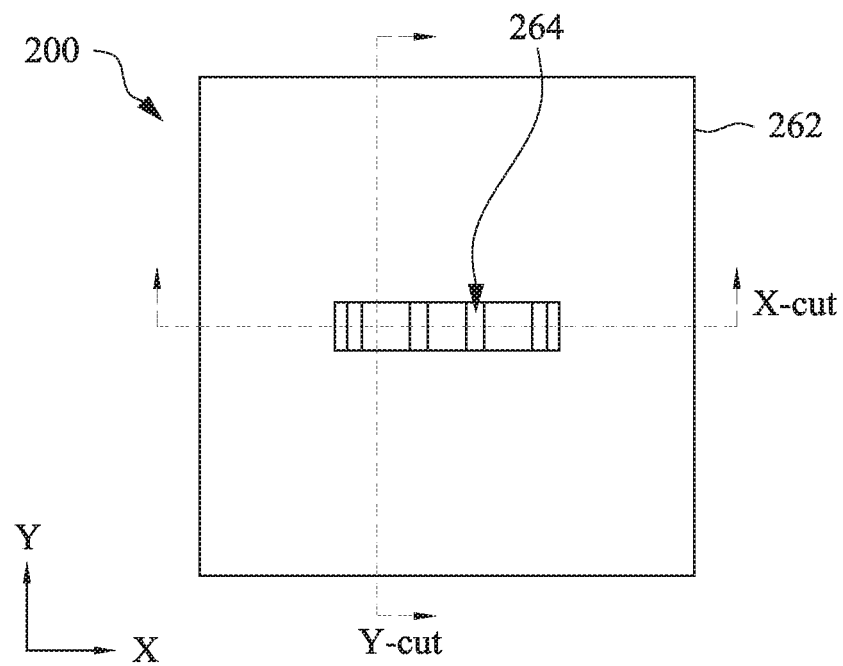
Figure 5B:
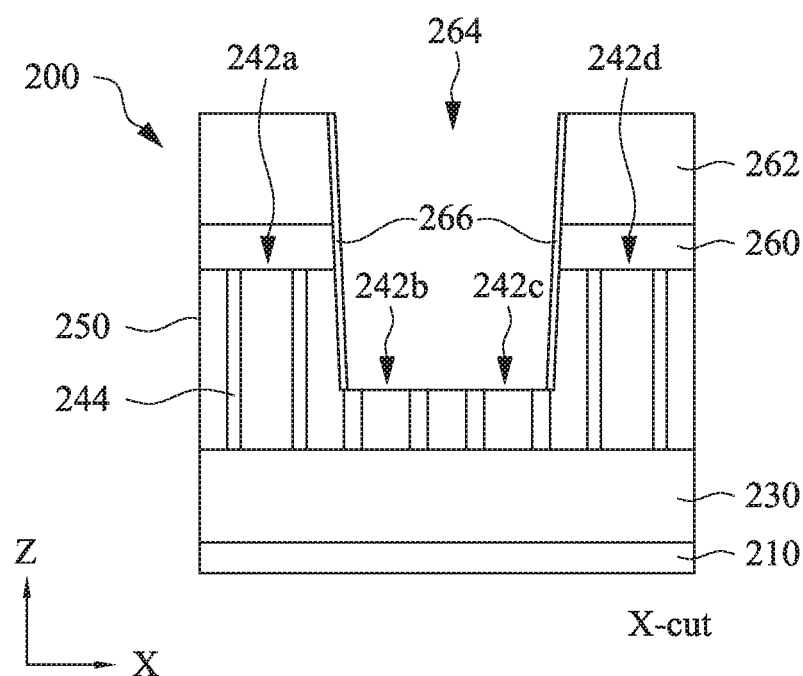
Figure 5C:
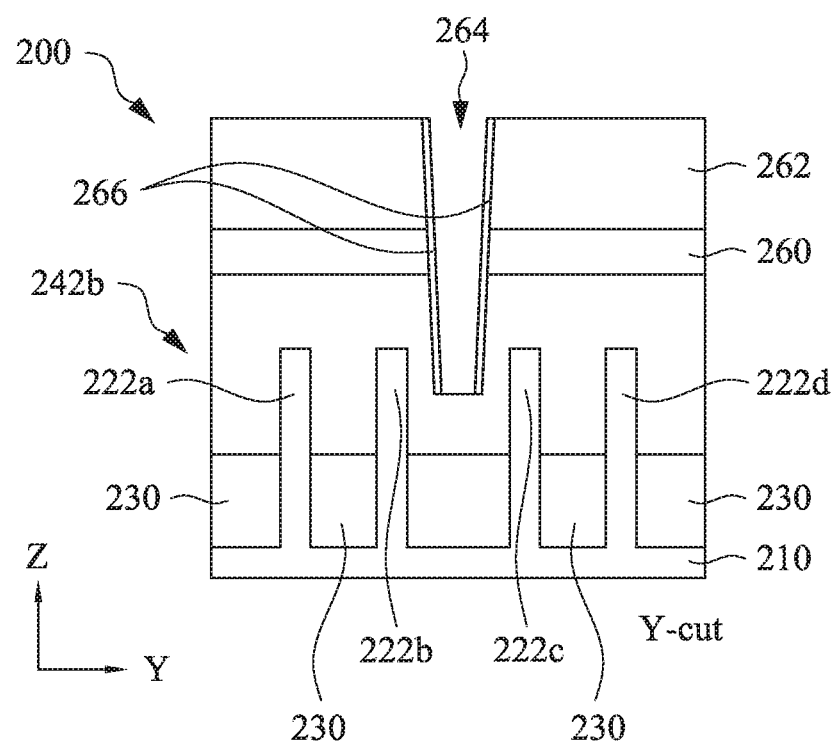
Figure 6A:
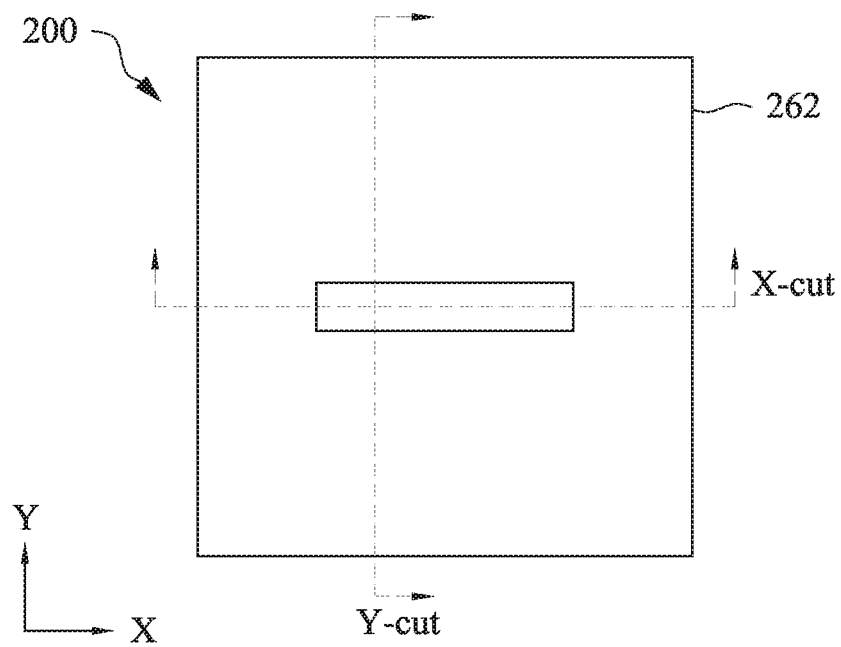
Figure 6B:
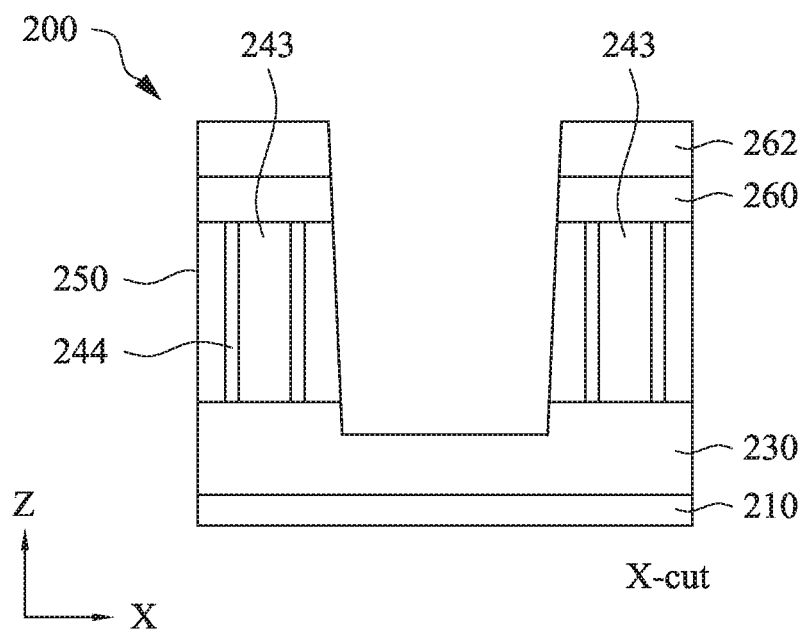
Figure 6C:
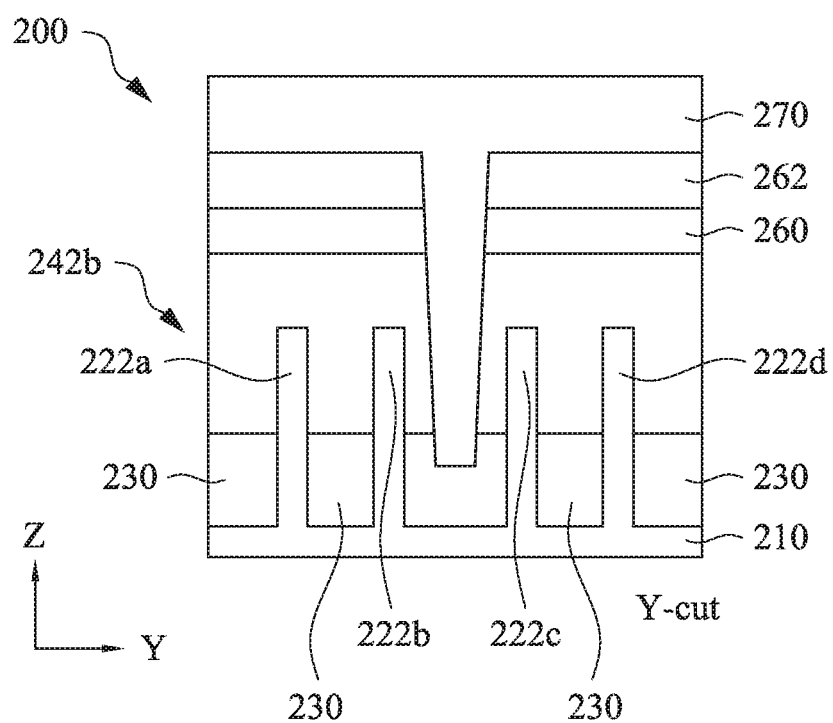

FIG. 1 is a flow chart of a method 100 for fabricating an IC device (or device structure) according to various aspects of the present disclosure. In some implementations, as described herein, method 100 fabricates an IC device that includes a FinFET device. Method 100 is merely an example, and is not intended to limit the present disclosure beyond what is explicitly recited in the claims. Additional operations can be provided before, during, and after method 100, and some operations described can be replaced, eliminated, or moved around for additional embodiments of the method. In the following discussion, method 100 is described with reference to FIGS. 2A-2C, 3A-3C, 4A-4C, 5A-5C, 6A-6C, and 7A-7D, which are fragmentary diagrammatic views of a FinFET device 200, in portion or entirety, at various fabrication stages (such as those associated with method 100) according to various embodiments of the present disclosure. In particular, FIGS. 2A-7A are top views of FinFET device 200 (for example, in an X-Y plane); FIGS. 2B-7B are diagrammatic cross-sectional views of FinFET device 200 in the X-direction respectively of FIGS. 2A-7A (for example, in an X-Z plane; also referred to as an X-cut); FIGS. 2C-7C are diagrammatic cross-sectional views of FinFET device 200 in the Y-direction respectively of FIGS. 2A-7A (for example, in a Y-Z plane; also referred to as a Y-cut); and FIG. 7D is a cross-sectional view of FinFET device 200 in the Z-direction of FIG. 7B (for example, in an X-Y plane; also referred to as a Z-cut).

FinFET device 200 generally refers to any fin-based transistor, which can be included in a microprocessor, memory cell, and/or other IC device. Furthermore, FinFET device 200 may be an intermediate device fabricated during processing of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOSs) transistors, bipolar transistors, high voltage transistors, high frequency transistors, other suitable components, or combinations thereof. FIGS. 2A-2C, 3A-3C, 4A-4C, 5A-5C, 6A-6C, and 7A-7D have been simplified for the sake of clarity to better understand the inventive concepts of the present disclosure. Additional features can be added in FinFET device 200, and some of the features described below can be replaced, modified, or eliminated in other embodiments of FinFET device 200.

Figure 2A:
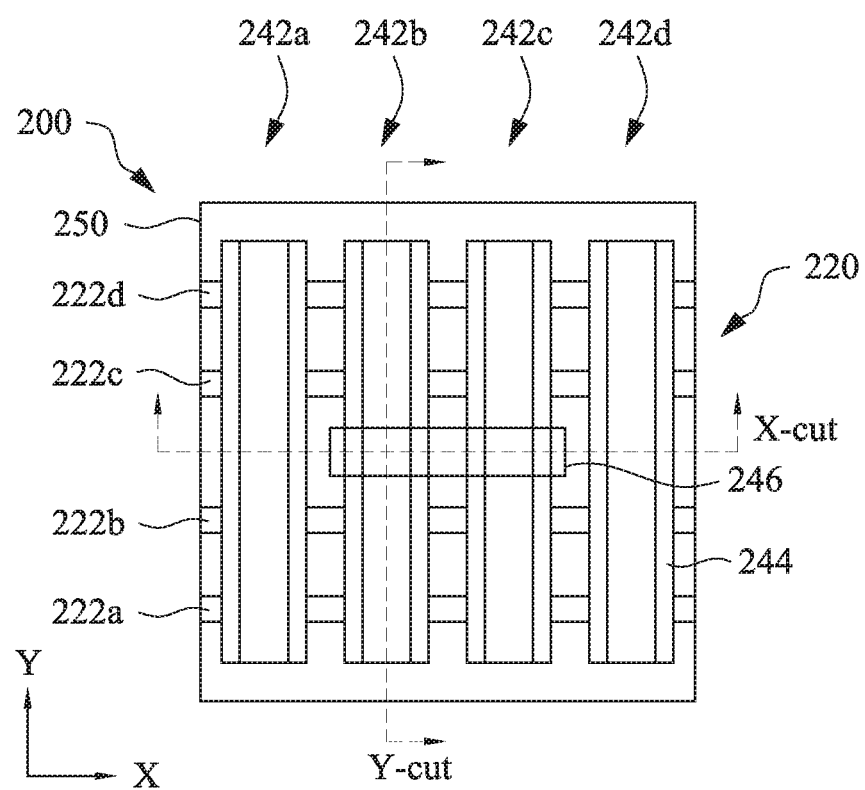
FIGS. 2A, 3A, 4A, 5A, 6A, 7A, FIGS. 2B, 3B, 4B, 5B, 6B, 7B, FIGS. 2C, 3C, 4C, 5C, 6C, 7C, and FIG. 7D are fragmentary diagrammatic views of a FinFET device, in portion or entirety, at various fabrication stages (such as those associated with the method of FIG. 1) according to various aspects of the present disclosure.
Figure 2B:
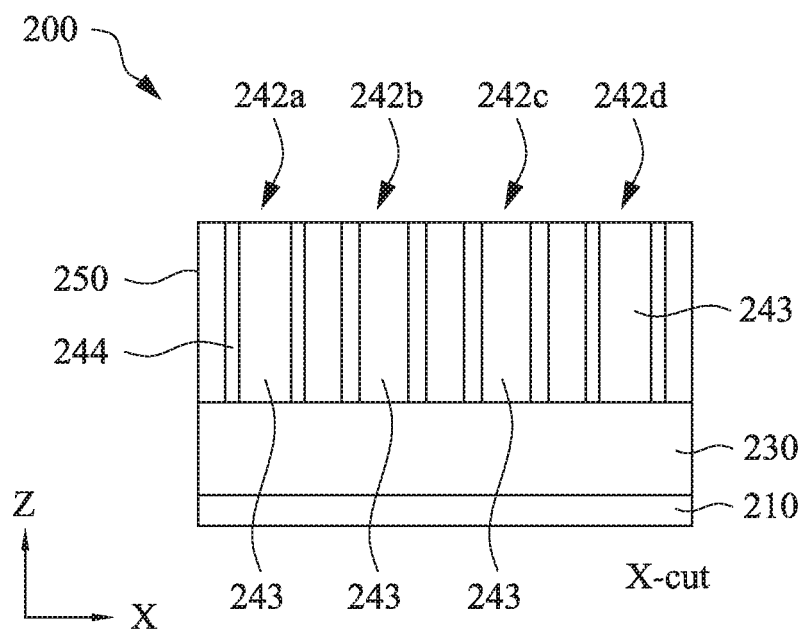
Figure 2C:
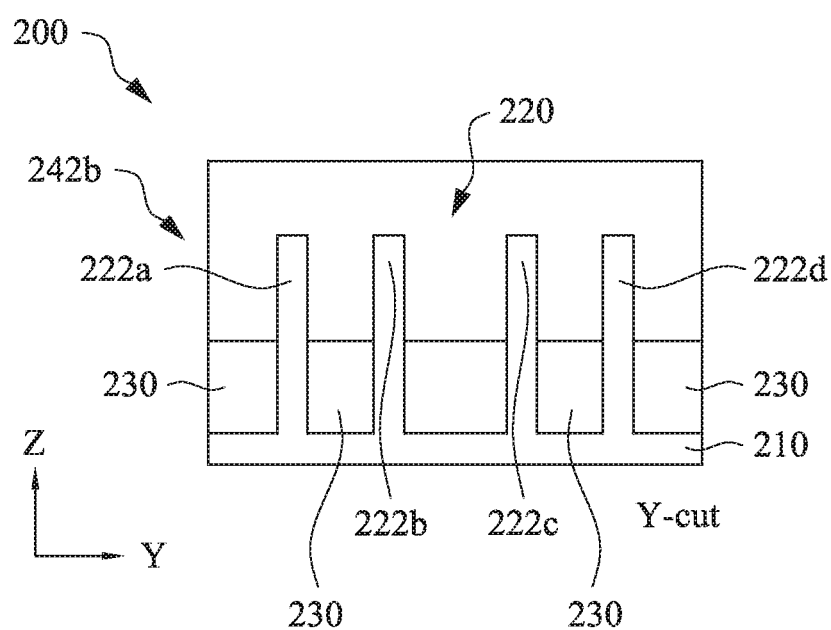
Figure 3A:
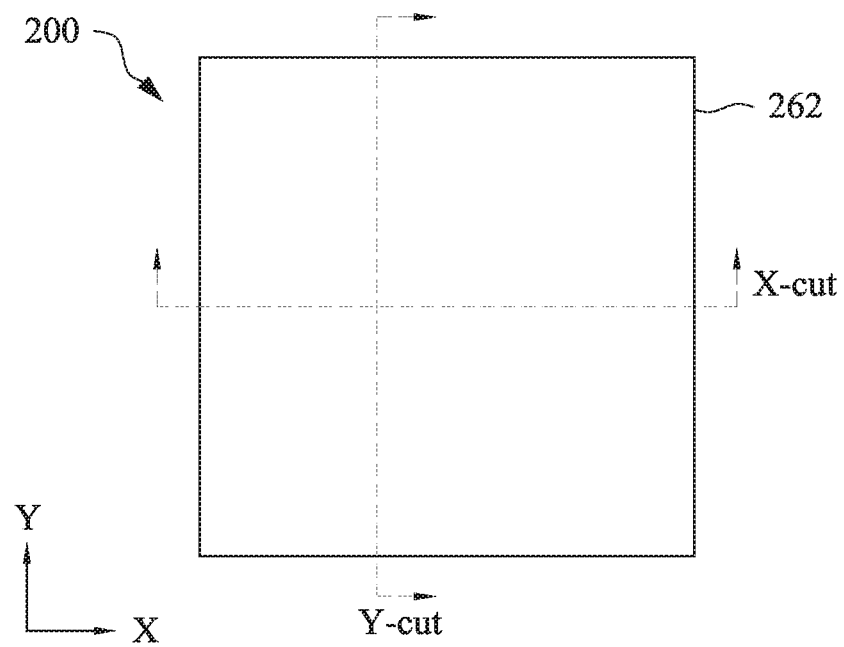
Figure 3B:
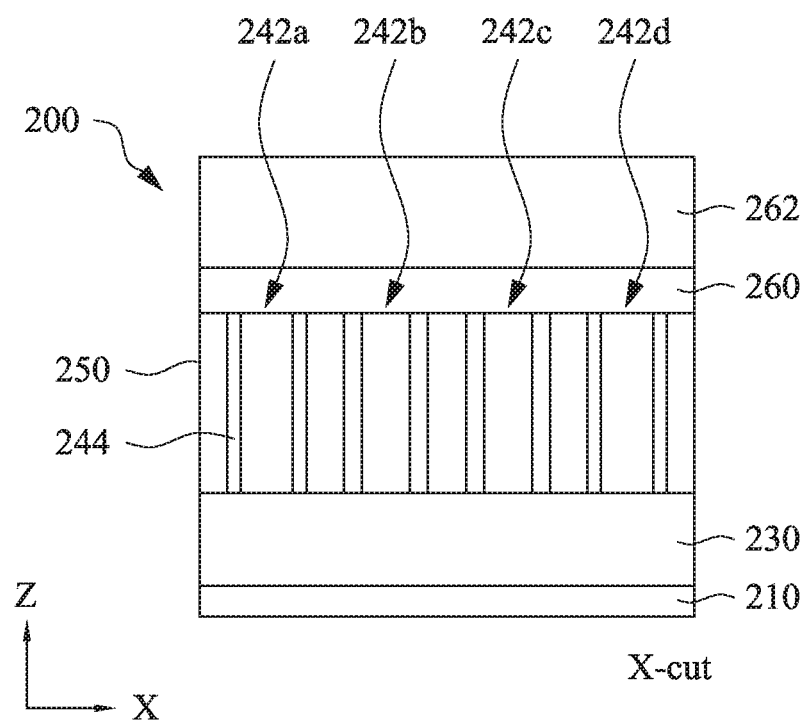
Figure 3C:
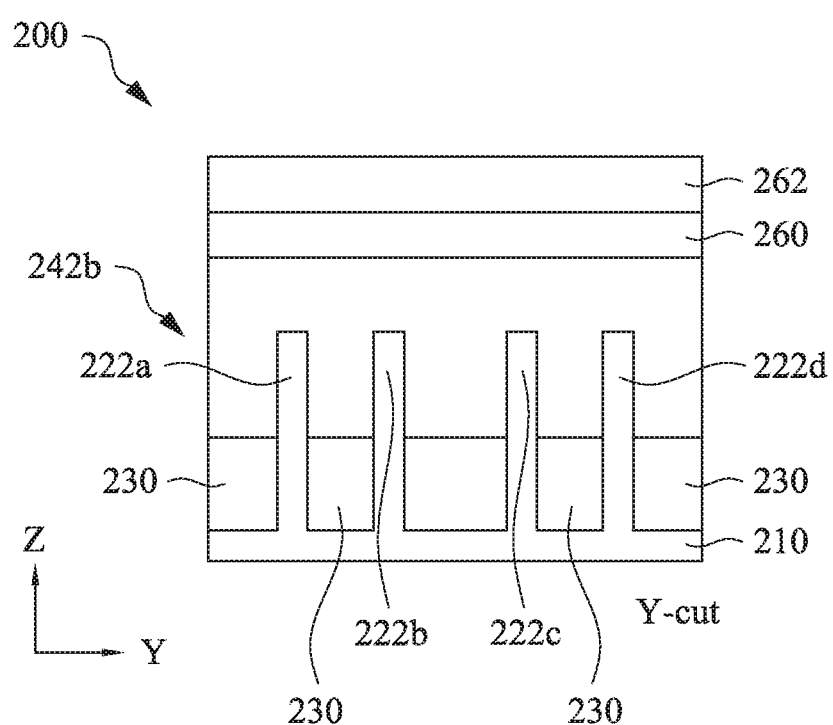

As shown in FIG. 2B and FIG. 2C, FinFET device 200 includes a substrate (wafer) 210. In the depicted embodiment, substrate 210 includes silicon. Alternatively or additionally, substrate 210 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 210 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 210 can include various doped regions (not shown) depending on design requirements of FinFET device 200. In some implementations, substrate 210 includes p-type doped regions (for example, p-type wells) doped with p-type dopants, such as boron, indium, other p-type dopant, or combinations thereof. In some implementations, substrate 210 includes n-type doped regions (for example, n-type wells) doped with n-type dopants, such as phosphorus, arsenic, other n-type dopant, or combinations thereof. In some implementations, substrate 210 includes doped regions formed with a combination of p-type dopants and n-type dopants. The various doped regions can be formed directly on and/or in substrate 210, for example, providing a p-well structure, an n-well structure, a dual-well structure, a raised structure, or combinations thereof. An ion implantation process, a diffusion process, and/or other suitable doping process can be performed to form the various doped regions in substrate 210.

At operation 110, method 100 forms a plurality of fins over substrate 210. As shown in FIG. 2B and FIG. 2C, four fins 222a, 222b, 222c, and 222d are formed over substrate 210, although it should be noted that the present disclosure contemplates embodiments where a single fin (or any other suitable number of fins) is formed over substrate 210. In some implementations, fins 222a-222d are considered a portion of substrate 210 (such as a portion of a material layer of substrate 210). For example, in the depicted embodiment, where substrate 210 includes silicon, and fins 222a-222d include silicon. Alternatively, in some implementations, fins 222a-222d are defined in a material layer including a semiconductor material overlying substrate 210, such as silicon germanium. In some implementations, fins 222a-222d can include a semiconductor layer stack (e.g., a heterostructure) having various semiconductor layers. The semiconductor layers include any suitable material(s), such as silicon, germanium, silicon germanium, other suitable material, or combinations thereof. The semiconductor layers can include same or different materials, etching rates, constituent atomic percentages, constituent weight percentages, thicknesses, and/or configurations depending on design requirements of FinFET device 200.

In FIG. 2C, fins 222a-222d extend from substrate 210 in a Z-direction, such that each fin has a height defined in the Z-direction, a length defined in an X-direction, and a width defined in a Y-direction. Each fin includes a channel region disposed between a source region and a drain region. Source/drain (S/D) features may be formed in fins 222a-222d such as lightly doped S/D regions and/or heavily doped S/D regions. In some implementations, S/D features may be partially embedded in a fin and rise above it, such as epitaxially grown semiconductor material with proper dopant(s).

Fins 222a-222d are formed over substrate 210 by any suitable method. For example, fins 222a-222d may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over substrate 210 and patterned using a photolithography process. Spacers are formed alongside the patterned sacrificial layer using a self-aligned process. The sacrificial layer is then removed, and the remaining spacers, or mandrels, may then be used to pattern fins 222a-222d by etching substrate 210. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant.

As shown in FIG. 2B and FIG. 2C, one or more isolation features 230 may be disposed over and/or in substrate 210 to isolate various regions (e.g., device regions) of FinFET device 200. For example, isolation features 230 are disposed between fins 222a-222d to separate and isolate fins 222a-222d from each other. In the depicted embodiment, isolation features 230 surround a portion of fins 222a-222d, such as a bottom portion of fins 222a-222d. Isolation features 230 include silicon oxide, silicon nitride, silicon oxynitride, other suitable isolation material, or combinations thereof. Isolation features 230 may include different structures, such as shallow trench isolation (STI) structures, deep trench isolation (DTI) structures, and/or local oxidation of silicon (LOCOS) structures. In some implementations, isolation features 230 include STI features that define and electrically isolate fins 222a-222d from other active device regions and/or passive device regions. For example, STI features can be formed by etching trenches in substrate 210 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation features 230. In another example, STI features can be formed by depositing an insulator material over substrate 210 after forming fins 222a-222d (in some implementations, such that the insulator material layer fills gaps or trenches between fins 222a-222d) and etching back the insulator material layer to form isolation features 230. In some implementations, STI features include a multi-layer structure that fills the trenches. For example, STI features include a silicon nitride layer disposed over a thermal oxide liner layer. In another example, STI features include a dielectric layer disposed over a doped liner layer (such as a boron silicate glass (BSG) liner layer or a phosphosilicate glass (PSG) liner layer). In yet another example, STI features include a bulk dielectric layer disposed over a liner dielectric layer, where the bulk dielectric layer and the liner dielectric layer include materials depending on design requirements.

At operation 115, method 100 forms a plurality of dummy gate structures over substrate 210 and fins 222a-222d. The dummy gate structures (not labeled in figures) are to be replaced by metal gate structures 242a, 242b, 242c, and 242d via a metal gate replacement process in operation 130. The dummy gate structures may be formed using any suitable processes. Each dummy gate structure may include a gate dielectric layer (such as silicon oxide) and a gate electrode (such as polysilicon) on the gate dielectric layer. The formation of each dummy gate structure includes forming various gate material layers (such as thermal oxidation to form silicon oxide and depositing polysilicon), and patterning the gate material layers using lithography process and etching. The dummy gate structures traverse fins 222a-222d. For example, when fins 222a-222d extend along a first direction (X-direction), the dummy gate structures extend along a second direction (Y-direction) that is substantially perpendicular to the X-direction.

At operation 120, method 100 forms an inter-layer dielectric (ILD) layer 250 over substrate 210, fins 222a-222d, and the dummy gate structures formed in operation 115. For example, ILD layer 250 can be formed by a deposition process, such as chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof). ILD layer 250 includes a dielectric material, such as silicon oxide, silicon nitride, silicon oxynitride, tetraethylorthosilicate (TEOS) formed oxide, phosphosilicate glass (PSG), borophosphosilicate glass (BPSG), low-k dielectric material, or other suitable dielectric material, or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, or combinations thereof. In some implementations, ILD layer 250 can include a multilayer structure having multiple dielectric materials. ILD layer 250 may undergo other processes such as CMP and selective etching to facilitate the formation of structures on top of ILD layer 250. For example, in some embodiments, an upper portion of ILD layer 250 is removed by CMP to facilitate the formation of metal gate structures 242a, 242b, 242c, and 242d.

At operation 130, method 100 replaces dummy gate structures formed during operation 115 with metal gate structures 242a-242d over fins 222a-222d. As shown in FIG. 2A, metal gate structures 242a-242d traverse fins 222a-222d. In some implementations, fins 222a-222d extend along a first direction (X-direction), and metal gate structures 242a-242d extend along a second direction (Y-direction) that is substantially perpendicular to the X-direction. Each metal gate structure has a height defined in the Z-direction, a length defined in the Y-direction, and a width defined in the X-direction. As shown in FIG. 2B, metal gate structures 242a-242d wrap channel regions of fins 222a-222d, thereby engaging fins 222a-222d and interposing source regions and drain regions of fins 222a-222d. FIG. 2B shows metal gate structures 242a-242d as touching isolation features 230, but metal gate structures 242a-242d may not be in physical contact with isolation features 230 (e.g., metal gate structures 242a-242d may penetrate an upper portion of ILD layer 250). FIG. 2B and FIG. 2C illustrate four metal gate structures as an example, but there may be any suitable number of metal gate structures.

Each of metal gate structures 242a-242d may be a multi-layer structure. For example, each metal gate structure may include a metal gate 243 and spacers 244 as sidewalls of the respective metal gate structure. Each metal gate 243 may include a gate dielectric layer and a gate electrode layer disposed over the gate dielectric layer. The gate dielectric layer may include a high-k dielectric layer such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof; and may be formed by ALD and/or other suitable methods. The gate electrode layer of each metal gate structure may include a p-type work function metal layer, or an n-type work function metal layer, or both. The p-type work function metal layer may include titanium nitride (TiN), tantalum nitride (TaN), ruthenium (Ru), molybdenum (Mo), tungsten (W), platinum (Pt), or combinations thereof. The n-type work function metal layer may include titanium (Ti), aluminum (Al), tantalum carbide (TaC), tantalum carbide nitride (TaCN), tantalum silicon nitride (TaSiN), or combinations thereof. The p-type or n-type work function metal layer may include a plurality of layers and may be deposited by CVD, PVD, and/or other suitable process. The gate electrode layer may further include a metal fill (or a bulk metal) layer that includes aluminum (Al), tungsten (W), cobalt (Co), copper (Cu), and/or other suitable materials, and may be formed by CVD, PVD, plating, and/or other suitable processes. Each metal gate 243 may include other layers, for example, capping layers, interface layers, diffusion layers, barrier layers, hard mask layers, or combinations thereof. In an embodiment, each metal gate 243 comprises multiple layers including, from bottom to top, a titanium silicon nitride (TiSiN) layer, a tantalum nitride (TaN) layer, a titanium nitride (TiN) layer, and a tungsten (W) layer. Spacers 244 may include a dielectric material, such as silicon oxide, silicon nitride, silicon oxynitride, silicon carbide, other dielectric material, or combination thereof. Spacers 244 may be a single layer or multi-layer structure. For example, in some implementations, spacers 244 include a multi-layer structure, such as a silicon nitride layer and a silicon oxide layer.

In order to realize functional features, metal gate structures 242a-242d are cut in certain sections during fabrication of FinFET device 200. For example, as shown in FIG. 2C, a cut window 246 may be defined to cut metal gate structures 242b and 242c (e.g., via anisotropic etching), separating them into four metal gates. Cut window 246 may reside between fins 222b and 222c. Such a cutting pattern may be used in various circuit configurations such as a static random-access memory (SRAM) cell (e.g., a six-transistor SRAM cell). In some implementations, the size and location of cut window 246 are configured so as to remove a portion of metal gate structure 242b, a portion of metal gate structure 242c, and a portion of ILD layer 250 between and adjacent to metal gate structures 242b and 242c. In other words, metal gate structures 242b and 242c can be effectively cut while retaining both (1) portions of ILD layer 250 that reside, in the X-direction, between cut window 246 and metal gate structures 242a and 242d and (2) portions of metal gate structures 242b and 242c that reside, in the Y-direction, between cut window 246 and fins 222b and 222c. Cutting metal gate structures 242b and 242c using cut window 246 involves various processes, which are described below.

Since metal gate structures 242a-242d are to be selectively cut, a patterning layer helps determine the locations of cuts. Thus, at operation 140, method 100 forms a patterning layer over FinFET device 200 (e.g., over metal gate structures 242a-242d and ILD layer 250). The patterning layer may be a multi-layer structure. For example, in FIGS. 3A-3C, the patterning layer includes a barrier (or capping) layer 260 and a hard mask layer 262. Barrier layer 260 is disposed over fins 222a-222d, metal gate structures 242a-242d, and ILD layer 250, and hard mask layer 262 is formed over barrier layer 260. Barrier layer 260 may be formed via deposition and may have any suitable thickness, such as about 5 nm or between 1 nm to 6 nm. In some implementations, barrier layer 260 comprises one or more hard materials (e.g., with high Vickers hardness) such as titanium nitride and/or titanium silicon nitride. Barrier layer 260 is a preparatory layer that helps processes downstream. For example, after completing processes shown in FIGS. 2A-2C, 3A-3C, 4A-4C, 5A-5C, 6A-6C, and 7A-7D, structures above barrier layer 260 may be removed by CMP, during which process barrier layer 260 may serve as a CMP stop layer to protect underlying structures from being removed. Hard mask layer 262 may be a nitride layer, for example, containing silicon nitride or titanium nitride.

Figure 4A:
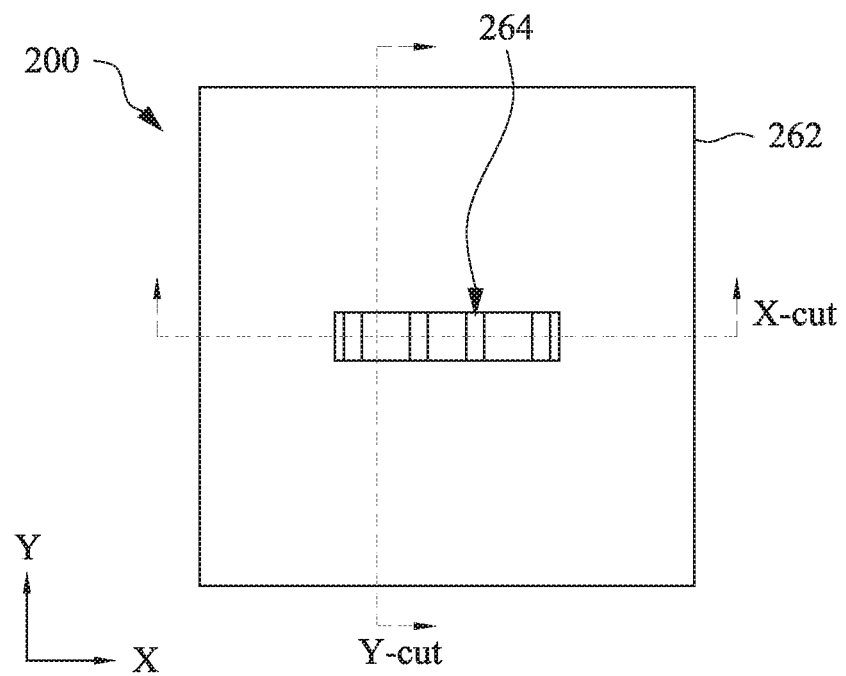
Figure 4B:
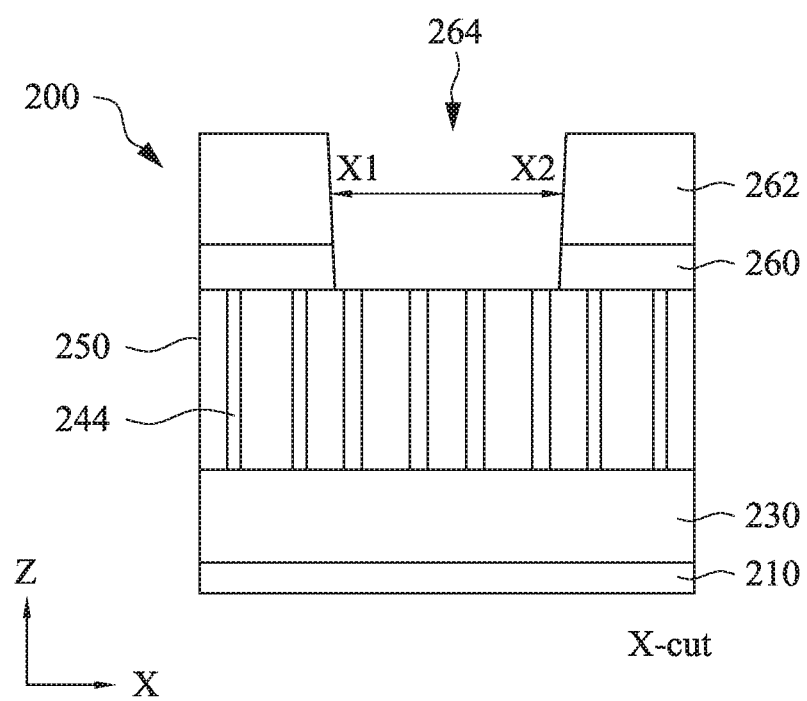
Figure 4C:
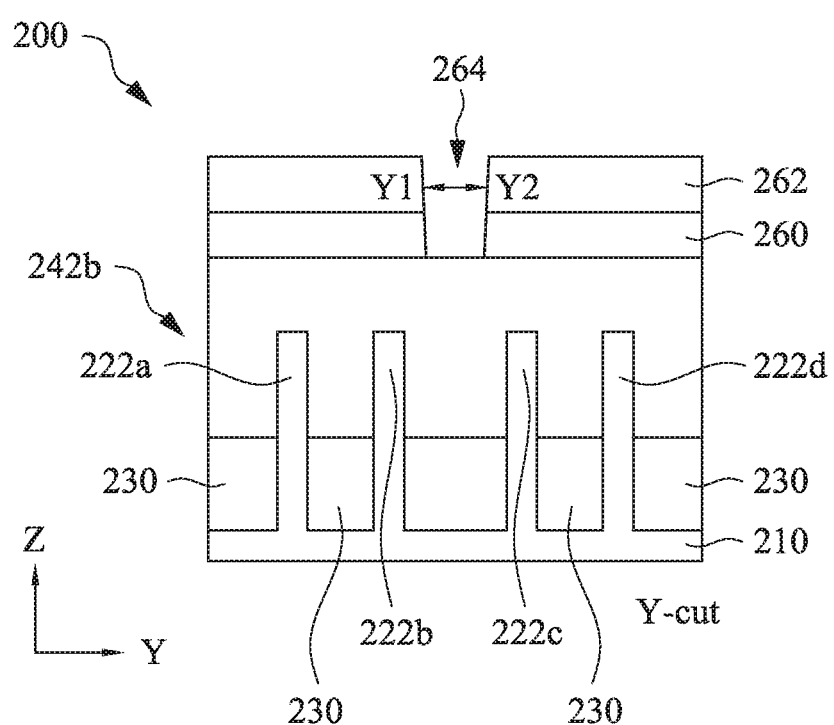

At operation 150, method 100 creates an opening 264 in the patterning layer for cutting metal gate structures 242b and 242c. Turning to FIGS. 4A-4C, opening 264 is formed in hard mask layer 262 and barrier layer 260. Opening 264 may be formed by one or more anistropical etching processes. In some implementations, hard mask layer 262 is etched first, and barrier layer 260 is etched next to extend opening 264 to ILD layer 250. Barrier layer 260 may serve as a stop layer while opening hard mask layer 262 with better through pattern loading. Opening 264 defines and corresponds to cut window 246 in FIG. 2C for the selective cutting of metal gate structures 242b and 242c. Depending on the horizontal level of measurement, opening 264 may have a slightly different size due to the tapering effect of multi-layer etching.

Opening 264 defines the cutting pattern of metal gate structures 242b and 242c, which may be used in various circuit configurations such as a six-transistor (6T) SRAM cell. Therefore, in some implementations, the size and location of opening 264 in both the X- and Y-directions are configured to optimize metal gate cutting. For example, in the X-direction shown in FIG. 4B, opening 264 exposes the entire widths of metal gate structures 242b and 242c and exposes a portion of ILD layer 250 (between metal gate structures 242a and 242b, between metal gate structures 242b and 242c, as well as between metal gate structures 242c and 242d). In other words, opening 264 extends from point X1 to point X2, where point X1 is located between metal gate structures 242a and 242b, and point X2 is located between metal gate structures 242c and 242d. Opening 264 does not expose metal gate structures 242a and 242d. Since opening 264 is used to remove (e.g., via etching) metal gate structures 242b and 242c (and not metal gate structures 242a or 242d), such a configuration in the X-direction allows opening 264 to effectively remove metal gate structures 242b and 242c without potentially exposing metal gate structures 242a and 242d to etching. Additionally, in the Y-direction shown in FIG. 4C, opening 264 (between points Y1 and Y2) is configured to be sufficiently big for effective removal of metal gate structure 242b exposed by opening 264, but sufficiently small (e.g., not exposing fins 222b and 222c) for preventing functional portions of metal gate structure 242b from potentially being etched. For example, the opening 264 may be about 10 nm or between 8 nm to 14 nm in the Y-direction.

Opening 264 may be formed by any suitable method, e.g., using dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in DHF; KOH solution; ammonia; a solution containing HF, $HNO_3$, and/or $CH_3COOH$; or other suitable wet etchant. After etching through hard mask layer 262 and barrier layer 260, opening 264 exposes a portion of metal gate structure 242b, a portion of metal gate structure 242c, and a portion of ILD layer 250 between and adjacent to metal gate structures 242b and 242c.

At operation 160, method 100 removes (e.g., via simultaneous etching) the exposed portion of metal gate structure 242b, the exposed portion of metal gate structure 242c, and the exposed portion of ILD layer 250. Turning to FIGS. 5A-5C, selective portions of metal gate structures 242b and 242c as well as ILD layer 250 are cut or removed according to opening 264. The selective removal or cutting may use any suitable method. While cutting metal gate structures 242b and 242c, it is helpful to prevent or minimize horizontal expansion of opening 264, which may cause undesirable etching of metal gate structures 242a and 242d (or fins 222b and 222c). Therefore, in some implementations, an anisotropic etching process is used to cut metal gate structures 242b and 242c. For example, an anisotropic dry etching process may use an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. Further, simultaneous etching of the exposed portion of metal gate structure 242b, the exposed portion of metal gate structure 242c, and the exposed portion of ILD layer 250 may remove these portions at the same or different speeds. In some implementations, an etchant is chosen to have similar etch selectivity (e.g., about 1:1) between ILD layer 250 and metal gate structures 242b and 242c. As shown in FIG. 5B, such etch selectivity allows ILD layer 250 and metal gate structures 242b and 242c to be removed at substantially the same etch rate, creating a relatively smooth bottom surface of opening 264. Note that, as each metal gate structure may include different layers and materials (e.g., gate electrode layer, dielectric layer, and spacers), the etch selectivity between ILD layer 250 and metal gate structures 242b and 242c may vary depending on the stage or duration of etching. In other words, different layers of metal gate structures 242b and 242c may be removed at different etch rates. In some implementations, ILD layer 250 and metal gate structures 242b and 242c have an overall similar etch selectivity (e.g., about 1:1) with respect to the etchant. In other implementations, the etchant may etch ILD layer 250 and metal gate structures 242b and 242c at different etch rates.

Cutting metal gate structures 242b and 242c may be performed in one or more etching cycles. In some implementation, a plurality of etching cycles are used to cut metal gate structures 242b and 242c, where each etching cycle removes an incremental or partial thickness of various surfaces exposed to the etchant (e.g., metal gates 243, spacers 244 adjacent to metal gates 243, portions of ILD layer 250 between and adjacent to metal gate structures 242b and 242c, and hard mask layer 262).

Moreover, one or more cycles of the metal gate cutting process may involve additional steps. For instance, in an implementation shown in FIG. 5B and FIG. 5C, in an etching cycle, an etch protection layer 266 is conformably deposited over exposed surfaces of FinFET device defining opening 264, and then the etchant anisotropically etches such exposed surfaces (including etch protection layer 266 and other underlying materials). Since anisotropic etching removes etch protection layer 266 much faster on horizontal surfaces (e.g., bottom surface of FinFET device 200 defining opening 264) than on tapered or vertical surfaces (e.g., sidewall surfaces of FinFET device defining opening 264). As a result, etch protection layer 266 remains on the sidewall surfaces of FinFET device 200 defining opening 264 much longer than on the bottom surface of FinFET device 200 defining opening 264. Indeed, etch protection layer 266 may partially remain on the sidewall surfaces long after etch protection layer 266 and underlying materials (portions of metal gate structures 242b and 242c and ILD layer 250) are removed at the bottom surface. Further, as etch protection layer 266 may also be deposited over a top surface of hard mask layer 262 in each etching cycle, this portion of etch protection layer 266 and an incremental thickness of hard mask layer 262 may be subsequently removed in each etching cycle.

The duration of an etching cycle may be controlled or tailored such that it ends before etch protection layer 266 on the sidewall surfaces is penetrated through. Etch protection layer 266 effectively prevents the horizontal dimension of opening 264 from expanding, thereby maintaining the intended horizontal size of opening (cut window) 246. Further, the etch protection layer 266 also serves as a homogeneous and uniform layer of material on the sidewall surfaces, thereby preventing an uneven sidewall profile.

By using an anisotropic etching process to cut metal gate structures 242b and 242c, horizontal expansion of opening 264 is prevented, thereby maintaining critical dimensions (CD) in X- and Y-directions. Therefore, the duration of the metal gate cutting process may be flexibly controlled to ensure complete removal of the portions of metal gate structures 242b and 242c that are exposed by opening 264. In other words, operation 160 may effectively remove the portions of metal gate structures 242b and 242c without leaving any residue thereof. As a result, operation 160 avoids any isolation issues caused by residual metal in opening 264. In some implementations, since metal gate structures 242b and 242c does not extend into any isolation feature 230, operation 160 continues even after a top thickness of isolation feature 230 is removed. As shown in FIGS. 6A-6C, opening 264 is extended into isolation feature 230.

Figure 7A:
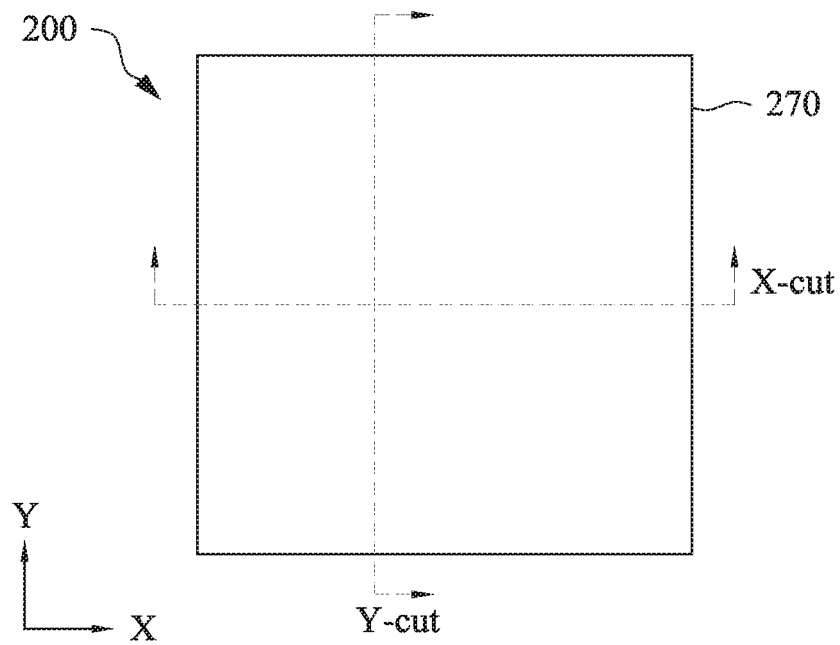
Figure 7B:
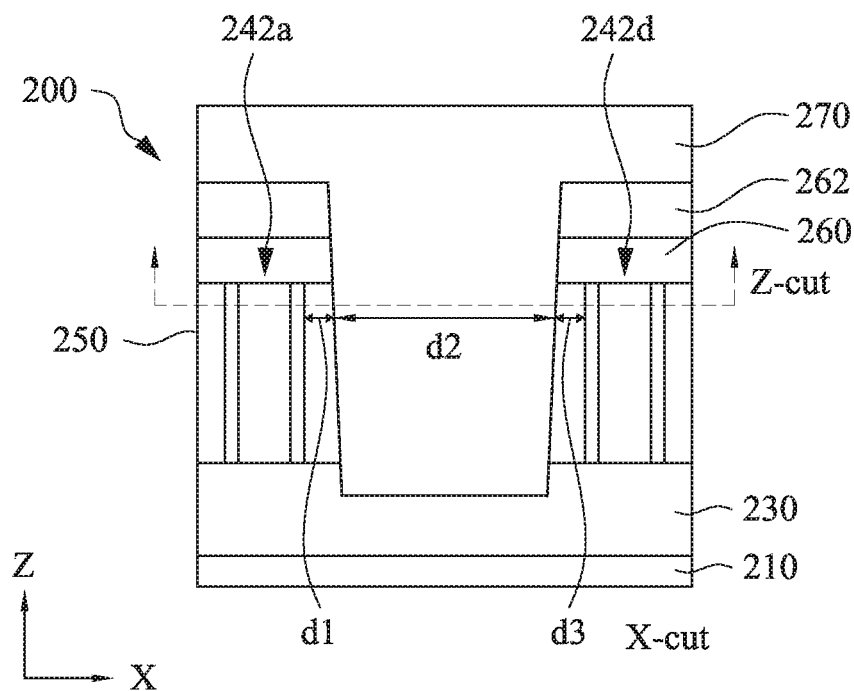
Figure 7C:
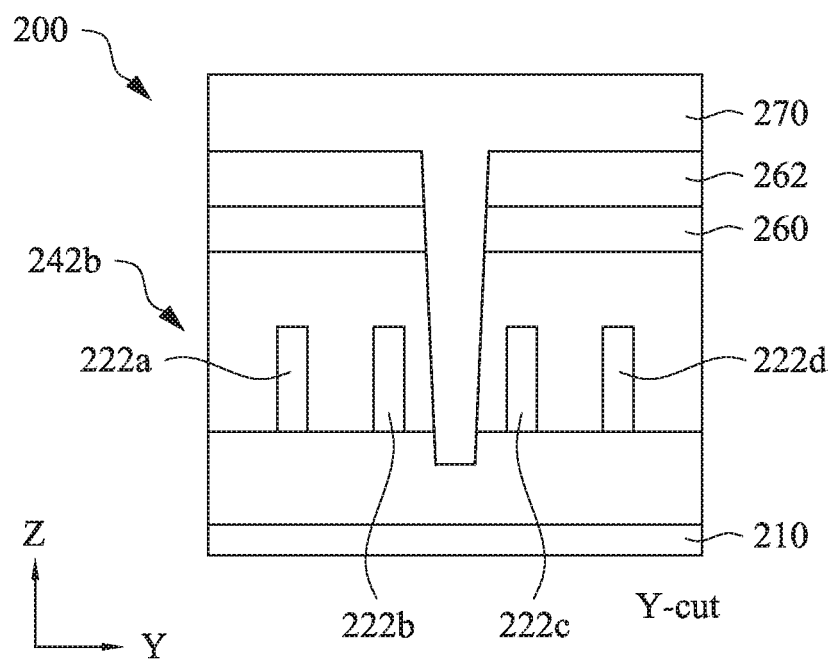
Figure 7D:
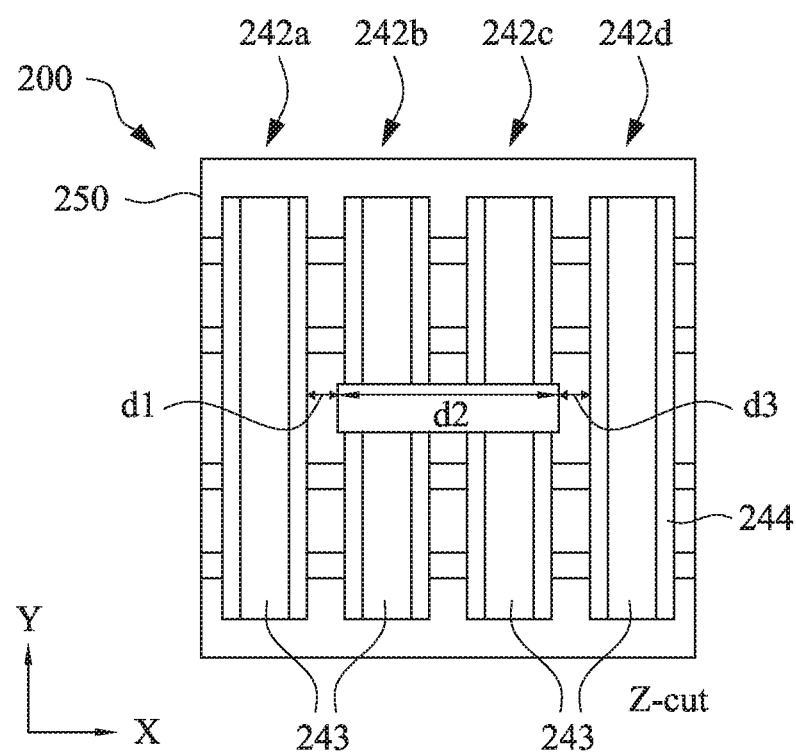

At operation 170, method 100 deposits one or more dielectric materials into opening 264 to form ILD layer 270, as shown in FIGS. 7A-7D. ILD layer 270 may also cover the top surface of hard mask layer 262. ILD layer 270 can be formed by a deposition process (such as CVD, PVD, ALD, HDPCVD, MOCVD, RPCVD, PECVD, LPCVD, ALCVD, APCVD, plating, other suitable methods, or combinations thereof). ILD layer 270 includes a dielectric material, such as silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, or combinations thereof. ILD layer 270 can include a multilayer structure having multiple dielectric materials. In some implementations, ILD layer 270 comprises different materials than those of ILD layer 250. Thus, after being filled by ILD layer 270, cut window 246 does not contain ILD layer 250 or any metal residue. As shown in FIGS. 7B and 7D, a distance between metal gate structures 242a and 242d in the X-direction is dividable into three contiguous sections including a first section d1, a second section d2, and a third section d3. ILD layer 250 resides in the first and third sections (d1 and d3), and ILD layer 270 resides in the second section d2. In some implementations, the second section d2 does not contain any metal residue from metal gates 243, or any of spacers 244, or ILD layer 250.

Method 100 may proceed to additional operations to complete the fabrication of FinFET device 200. For example, method 10 may form contact features, gate contact plugs (vias), and metal interconnects to connect terminals of various transistors to form an IC. As described above, structures of FinFET device 200 that reside above barrier layer 260 may be removed by a CMP process, during which barrier layer 260 may serve as a CMP stop layer to protect underlying structures from being removed.

The present disclosure provides for many different embodiments. Exemplary metal gate cutting techniques for FinFETs are disclosed herein. For example, a method comprises receiving an IC device structure that includes a substrate, one or more fins disposed over the substrate, a plurality of gate structures disposed over the one or more fins, a dielectric layer disposed between and adjacent to the plurality of gate structures, and a patterning layer disposed over the plurality of gate structures and the dielectric layer. The plurality of gate structures traverses the one or more fins and includes first and second gate structures. The method further comprises creating an opening in the patterning layer to expose a portion of the first gate structure, a portion of the second gate structure, and a portion of the dielectric layer between and adjacent to the first and second gate structures, and removing the exposed portion of the first gate structure, the exposed portion of the second gate structure, and the exposed portion of the dielectric layer.

In an embodiment, the removing the exposed portion of the first gate structure, the exposed portion of the second gate structure, and the exposed portion of the dielectric layer comprises performing an anisotropic etching process. In an embodiment, the anisotropic etching process uses an etchant with an etch selectivity of about 1:1 between the dielectric layer, the first gate structure, and the second gate structure. In an embodiment, the anisotropic etching process includes a plurality of etching cycles for removing, in thickness increments, the exposed portion of the first gate structure, the exposed portion of the second gate structure, and the exposed portion of the dielectric layer. In an embodiment, each of the plurality of etching cycles in the anisotropic etching process comprises: depositing an etch protection layer on a bottom surface and sidewall surfaces of the IC device structure defining the opening, and etching the etch protection layer on the bottom surface as well as an incremental thickness of the exposed portion of the first gate structure, the exposed portion of the second gate structure, and the exposed portion of the dielectric layer for a time period. The time period is controlled so as to avoid penetrating through the etch protection layer on the sidewall surfaces. In an embodiment, the etch protection layer is further deposited over a top surface of the patterning layer in each etching cycle, and wherein the etch protection layer and an incremental thickness of the patterning layer are subsequently removed in each etching cycle. In an embodiment, the patterning layer includes a barrier layer and a hard mask layer. The barrier layer is disposed over the plurality of gate structures and the dielectric layer, and the hard mask layer is disposed over the barrier layer. Creating the opening comprises etching through the hard mask layer and the barrier layer to expose the portion of the first gate structure, the portion of the second gate structure, and the portion of the dielectric layer In an embodiment, the removing the exposed portion of the first gate structure, the exposed portion of the second gate structure, and the exposed portion of the first dielectric layer penetrates partially through an isolation feature disposed on the substrate. In an embodiment, the dielectric layer is a first dielectric layer, wherein the removing the exposed portion of the first gate structure, the exposed portion of the second gate structure, and the exposed portion of the dielectric layer extends the opening, the method further comprising filling the extended opening with a second dielectric layer. In an embodiment, the one or more fins include first and second fins extending along a first direction, wherein the opening exposes in the first direction the portions of the first and second gate structures but does not expose any other of the plurality of gate structures. The plurality of gate structures extends along a second direction that is substantially perpendicular to the first direction. The opening extends in the second direction between the first and second fins, and wherein the opening does not expose the first or second fin.

The present disclosure also provides a method comprising forming a plurality of fins over a substrate and extending along a first direction, forming an ILD layer over the plurality of fins, forming a first metal gate structure and a second metal gate structure over the plurality of fins and extending along a second direction that is substantially perpendicular to the first direction, forming a patterning layer over the first and second metal gate structures and the ILD layer, and defining a cut window in the patterning layer for cutting the first and second metal gate structures. The cut window exposes a portion of the first metal gate structure, a portion of the second metal gate structure, and a portion of the ILD layer between and adjacent to the first and second metal gate structures. The method further comprises simultaneously etching the exposed portion of the first metal gate structure, the exposed portion of the second metal gate structure, and the exposed portion of the ILD layer.

In an embodiment, the first and second metal gate structures are formed by replacing dummy gate structures, wherein the first and second metal gate structures include metal gates and spacers disposed on sidewall surfaces of the metal gates. Simultaneously etching the exposed portion of the first metal gate structure and the exposed portion of the second metal gate structure comprises simultaneously etching the metal gates and the spacers. In an embodiment, the simultaneously etching comprises performing a dry etching process, and wherein the dry etching process uses an etchant configured to etch the ILD layer and the first and second metal gate structures at a substantially same etch rate. In an embodiment, the dry etching process includes a plurality of etching cycles for simultaneously etching, in thickness increments, the exposed portion of the first metal gate structure, the exposed portion of the second metal gate structure, and the exposed portion of the ILD layer. In an embodiment, wherein each of the plurality of etching cycles in the dry etching process comprises depositing an etch protection layer on a bottom surface and sidewall surfaces defining the cut window, and etching the etch protection layer on the bottom surface and an incremental thickness of the exposed portion of the first metal gate structure, the exposed portion of the second metal gate structure, and the exposed portion of the ILD layer for a time period. The time period is controlled so as to avoid penetrating through the etch protection layer on the sidewall surfaces. In an embodiment, the patterning layer includes a titanium nitride layer and a silicon nitride layer. The titanium nitride layer is disposed over the first and second metal gate structures and the ILD layer, and the silicon nitride layer is disposed over the titanium nitride layer. Defining the cut window comprises etching through the silicon nitride layer and the titanium nitride layer to expose the portion of the first metal gate structure, the portion of the second metal gate structure, and the portion of the ILD layer. In an embodiment, the ILD layer is a first ILD layer. Simultaneously etching the exposed portion of the first metal gate structure, the exposed portion of the second metal gate structure, and the exposed portion of the ILD layer extends the cut window. The method further comprises filling the extended cut window with a second ILD layer. In an embodiment, the plurality of fins include first and second fins extending along the first direction, wherein the cut window exposes in the first direction the portions of the first and second metal gate structures but does not expose any other metal gate structure. The cut window extends in the second direction between the first and second fins but does not expose the first or second fin.

The present disclosure also provides an IC device including a substrate, a first fin and a second fin disposed over the substrate and extending along a first direction, a first metal gate structure and a second metal gate structure disposed over the first and second fins and extending along a second direction that is substantially perpendicular to the first direction. For a portion of a distance between the first and second fins in the second direction, a distance between the first and second metal gate structures in the first direction is dividable into three contiguous sections including a first section, a second section, and a third section. The IC device further includes a first ILD layer disposed in the first and third sections, and a second ILD layer disposed in the second section such that the second section does not contain any portion of the first ILD layer, any portion of the first metal gate structure, or any portion of the second metal gate structure. In an embodiment, the IC device further includes an isolation feature disposed over the substrate and adjacent to the first and second fins, wherein the second ILD layer extends through an upper portion of the isolation feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first fin structure and a second fin structure over a substrate;
   forming a first gate structure over the first fin structure and a second gate structure over the second fin structure,
   forming a first dielectric layer between the first gate structure and the second gate structure;
   forming a first material layer over the first gate structure and the second gate structure;
   forming an opening in the first material layer that exposes at least the first gate structure and the first dielectric layer; and
   etching the exposed first gate structure and the exposed first dielectric layer by a plurality of etching cycles for etching, in thickness increments, the exposed first gate structure and the exposed first dielectric layer, wherein the etching of the exposed first gate structure and the exposed first dielectric layer by the plurality of etching cycles forms a trench extending through the first dielectric layer, the first dielectric layer defining opposing sidewalls and a bottom surface of the trench, and wherein at least one cycle of the plurality of etching cycles includes forming an etch protection layer on the bottom surface and opposing sidewall surfaces of the first dielectric layer prior to performing the at least one cycle of the plurality of etching cycles.

2. The method of claim 1, further comprising forming a shallow trench isolation structure over the substrate, wherein the shallow trench isolation structure is disposed between the first fin structure and the second fin structure, and
   wherein the etching of the exposed first gate structure and the exposed first dielectric layer by the plurality of etching forms a trench extending through the first dielectric layer between the first fin structure and the second fin structure.

3. The method of claim 2, further comprising forming a second dielectric material layer in the trench.

4. The method of claim 3, wherein the trench further extends through a portion of the shallow trench isolation structure, and
   wherein the second dielectric material interfaces with the shallow trench isolation structure.

5. The method of claim 1, wherein the etching of the exposed first gate structure and the exposed first dielectric layer by the plurality of etching cycles for etching, in thickness increments, the exposed first gate structure and the exposed first dielectric layer includes etching the second gate structure.

6. The method of claim 1, further comprising forming a second material layer over the first material layer, the first material layer being formed of a different material than the second material layer, and
   wherein the forming of the opening in the first material layer includes formed the opening in the second material layer.

7. A method comprising:
   forming a first fin structure over a substrate;
   forming a shallow trench isolation structure in the substrate;
   forming a first gate structure over the first fin structure;
   forming an interlayer dielectric layer on the first gate structure;
   replacing the first gate structure with a second gate structure;
   forming a barrier layer on the second gate structure;
   forming an opening in the barrier layer to expose the second gate structure and the interlayer dielectric layer; and
   etching the exposed second gate structure the exposed interlayer dielectric layer and the shallow trench isolation structure by a plurality of etching cycles for etching, in thickness increments, the exposed first gate structure, the exposed first dielectric layer and the shallow trench isolation structure to thereby form a trench that extends through a portion of the shallow trench isolation structure.

8. The method of claim 7, wherein at least one etching cycle includes performing an anisotropic etching process.

9. The method of claim 7, further comprising forming a hard mask layer directly on the barrier layer, and
   wherein forming the opening in the barrier layer includes forming the opening in the hard mask layer.

10. The method of claim 7, wherein the portion of the shallow trench isolation structure is exposed after the etching of the exposed second gate structure, the exposed interlayer dielectric layer and the shallow trench isolation structure by the plurality of etching cycles for etching.

11. The method of claim 10, further comprising forming a second interlayer dielectric layer directly on the exposed portion of the dielectric isolation feature.

12. The method of claim 7, wherein the forming of the first fin structure over the substrate includes forming a second fin structure,
wherein the forming of the first gate structure over the first fin structure includes forming a third gate structure over the second fin structure,
wherein the replacing of the first gate structure with the second gate structure includes replacing the third gate structure with the fourth gate structure,
wherein the opening in the barrier layer exposes the fourth gate, and
wherein the etching of the exposed second gate structure and the exposed interlayer dielectric layer by the plurality of etching cycles for etching, in thickness increments, the exposed first gate structure and the exposed first dielectric layer includes etching the fourth gate structure.

13. The method of claim 7, wherein the etching of the exposed second gate structure and the exposed interlayer dielectric layer by the plurality of etching cycles for etching, in thickness increments, the exposed first gate structure and the exposed first dielectric layer includes simultaneously etching the exposed second gate structure and the exposed interlayer dielectric layer.

14. The method of claim 7, wherein at least one cycle of the plurality of etching cycles includes forming an etch protection layer on opposing sidewall surfaces of the interlayer dielectric layer defining the trench prior to performing the at least one cycle of the plurality of etching cycles.

15. A device comprising:
a first fin structure and a second fin structure disposed over a substrate;
a first gate structure disposed over the first fin structure and a second gate structure disposed over the second fin structure, the first gate structure having a first sidewall facing a second sidewall of the second gate structure;
a first interlayer dielectric layer including a first portion disposed along the first sidewall of the first gate structure and a second portion disposed along the second sidewall of the second gate structure;
a dielectric isolation structure disposed on the substrate;
a barrier layer disposed directly on the first gate structure and the second gate structure;
a hard mask layer disposed directly on the barrier layer; and
a second interlayer dielectric layer extending between the first portion of the first interlayer dielectric layer and the second portion of the first interlayer dielectric layer, wherein the second interlayer dielectric layer extends through an upper portion of the dielectric isolation structure, wherein the second interlayer dielectric layer extends through the hard mask layer and the barrier layer.

16. The device of claim 15, wherein the second interlayer dielectric layer interfaces with the first portion of the first interlayer dielectric layer and the second portion of the first interlayer dielectric layer.

17. The device of claim 15, wherein the second interlayer dielectric layer is disposed over and physically contacts a top surface of the hard mask layer, the top surface of the hard mask layer facing away from the substrate.

18. The device of claim 15, wherein the first portion of the first interlayer dielectric layer physically contacts the first sidewall of the first gate structure, and
wherein the second portion of the first interlayer dielectric layer physically contacts the second sidewall of the second gate structure.

19. The device of claim 15, wherein the second interlayer dielectric layer extending between the first portion of the first interlayer dielectric layer and the second portion of the first interlayer dielectric layer includes an upper portion having a first width and a lower portion having a second width that is less than the first width.

20. The device of claim 15, wherein the dielectric isolation structure has a first sidewall surface facing a second sidewall surface and the second interlayer dielectric layer extends continuously from the first sidewall surface to the second sidewall surface of the dielectric isolation structure.

* * * * *